United States Patent
Adir et al.

(10) Patent No.: US 7,434,101 B2
(45) Date of Patent: Oct. 7, 2008

(54) HIGHLY SPECIALIZED SCENARIOS IN RANDOM TEST GENERATION

(75) Inventors: Allon Adir, Kiryat Tivon (IL); Roy Emek, Tel-Aviv-Jaffa (IL); Itai Jaeger, Lavon (IL); Eitan Marcus, Haifa (IL); Tzach Schechner, Tel Aviv-Jaffa (IL)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 11/085,791

(22) Filed: Mar. 21, 2005

(65) Prior Publication Data

US 2006/0212756 A1  Sep. 21, 2006

(51) Int. Cl.
*G06F 11/00* (2006.01)

(52) U.S. Cl. .......................................... 714/33
(58) Field of Classification Search .................... 714/33
See application file for complete search history.

(56) References Cited

U.S. PATENT DOCUMENTS

| | | | | |
|---|---|---|---|---|
| 6,519,727 | B2 * | 2/2003 | Noy | 714/724 |
| 6,530,054 | B2 * | 3/2003 | Hollander | 714/739 |
| 6,925,405 | B2 * | 8/2005 | Adir et al. | 702/119 |
| 7,007,207 | B2 * | 2/2006 | Emek et al. | 714/703 |
| 2003/0130813 | A1 * | 7/2003 | Adir et al. | 702/119 |
| 2004/0078742 | A1 * | 4/2004 | Emek et al. | 714/728 |
| 2005/0060132 | A1 * | 3/2005 | Hollander et al. | 703/14 |
| 2005/0203720 | A1 * | 9/2005 | Lagoon et al. | 703/2 |

OTHER PUBLICATIONS

U.S. Appl. No. 11/092,000, filed Mar. 29, 2005.
Bin, E. et al., "Using a Constraint Satisfaction Formulation and Solution Techniques for Random Test Program Generation", IBM Systems Journal, vol. 41, No. 3, Aug. 2002, pp. 386-402.
Haque, F. et al., "The Art of Verification with Vera", Chapter 8, pp. 229-248, Sep. 2001, published by Verification Central, 5178 Mowry Ave, #2137, Fremont, CA 94539.
Kumar, Vipin, "Algorithms for Constraint-Satisfaction Problems: A Survey", AI Magazine, 1992, vol. 13, No. 1, pp. 32-44.
Emek, Roy et al., "X-Gen: A Random Test-Case Generator for Systems and SoCs", IEEE International High Level Design Validation and Test Workshop (HLDVT), pp. 145-150, Oct. 2002.
Grinwald, R. et al., "User Defined Coverage—A Tool Supported Methodology for Design Verification", Proceedings of 38th Design Automation Conference (DAC98), Jun. 15-19, 1998, pp. 158-163.
Lichtenstein, Y. et al, "Model Based Test Generation for Processor Verification", Innovative Applications of Artificial Intelligence (IAAI), AAAI Press, 1994.

(Continued)

*Primary Examiner*—Bryce P Bonzo

(57) ABSTRACT

Improvements in functional verification of a design are achieved by providing a test template that specifies test parameters directed to a function of the design. An exemption mode of operation is associated with a portion of the template, in which constraints and variables associated with the template are revised. The template is an input to a CSP engine, which, in cooperation with a test generator engine, produces test scenarios that lie in an expanded region of the generator's usual operational space. Provision is made for independently enabling and disabling a plurality of exemption modes of operation that are associated with the same or different areas of the template.

2 Claims, 3 Drawing Sheets

OTHER PUBLICATIONS

Lewin, Daniel et al., "Constraint Satisfaction for Test Program Generation", Int. Phoenix Conference on Computers and Communications, Mar. 1995.

Aharon, A. et al., "Test Program Generation for Functional Verification of PowerPC Processors in IBM", 32nd Design Automation Conference, San Francisco, Jun. 1995, pp. 279-285.

* cited by examiner

HIGHLY SPECIALIZED SCENARIOS IN RANDOM TEST GENERATION

BACKGROUND OF THE INVENTION

1. Field of the Invention

This invention relates to functional verification of a design. More particularly, this invention relates to systems and methods for the efficient creation of legal scenarios for a design in order to achieve coverage in legal domains that are outside the operating domain of test generation in a simulation environment.

2. Description of the Related Art

Functional verification is widely acknowledged to be a bottleneck in a hardware system's design cycle. Indeed, up to 70% of development time and resources are typically spent on functional verification. Allowing users to find design flaws, and fixing them in a subsequent release would be unwise and costly for three main reasons: (1) harm to reputation and brand-name; (2) a high cost of recall and replacement when there is a large installed base; and (3) litigation, should design flaws cause injury.

In current industrial practice, dynamic verification is the main functional verification technique for large and complex systems. Dynamic verification is accomplished by generating a large number of tests using random test generators, simulating the tests on a design-under-verification, and checking that the design behaves according to its specification.

The rationale behind verification by simulation is that one acquires confidence in the correctness of a design-under-verification by running a set of test cases that encompass a sufficiently large number of different cases, which in some sense is assumed to be a representative sample of the full space of possible cases. The ability of the design-under-verification to correctly handle all cases is inferred from the correct handling of the cases actually tested. This approach is discussed, for example, in the document *User Defined Coverage—A Tool Supported Methodology for Design Verification*, Raanan Grinwald, Eran Harel, Michael Orgad, Shmuel Ur, and Avi Ziv, Proc. 38th Design Automation Conference (DAC38), pages 158-163, 1998. When conducting simulations, it is desirable to define a particular subspace, which is considered to be "interesting" in terms of verification, and then to generate tests selected at random that cover the subspace.

Test cases developed by algorithms such as the foregoing are typically implemented on a test generator, which may optionally bias the tests based on internal testing knowledge. In one approach, a model-based test generation scheme partitions a test generator into a generic, system independent engine, and a model, which describes the verified system. Under this scheme, the system model typically contains a description of the basic building blocks used to generate a test. Each of these modeled building block represents a constraint satisfaction problem (CSP), or a part of a CSP. CSP solution techniques are described in the documents *Using constraint satisfaction formulations and solution techniques for random test program generation*, E. Bin, R. Emek, G. Shurek, and A. Ziv, in IBM Systems Journal, August 2002, and *The Art of Verification with Vera*, F. Haque, K. Khan, and J. Michelson, Chapter 8, pages 229-248, September 2001, published by Verification Central, 5178 Mowry Ave, #2137, Fremont, Calif. 94539.

Model-based test generators are described in the following documents: *Model-Based Test Generation For Processor Design Verification*, Y. Lichtenstein, Y. Malka and A. Aharon, Innovative Applications of Artificial Intelligence (IAAI), AAAI Press, 1994; *Constraint Satisfaction for Test Program Generation*, L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM*, A. Aharon, D. Goodman, M. Levinger, Y. Lichtenstein, Y. Malka, C. Metzger, M. Molcho and G. Shurek, 32nd Design Automation Conference, San Francisco, June 1995, pp. 279-285.

The term coverage concerns checking and showing that testing has been thorough. Coverage is the prime measurement for the quality of a set of test cases. Simply stated, the idea in coverage is to create, in a systematic fashion, a large and comprehensive list of tasks, and to check that each task is executed in the testing phase. Ultimately, higher coverage implies greater chances of exposing a design flaw.

SUMMARY OF THE INVENTION

There are frequently gaps between the operational space allowed by the specification of a design-under-verification and the coverage domain of test cases that may be generated by a test generator using a given test template or set of test templates. Disclosed embodiments of the invention provide for generation of legal scenarios that lie in this gap. Generation of these scenarios is achieved by loosening the restrictions of a constraint satisfaction problem (CSP) in relevant areas. These restrictions are defined by the constraints and the domains of the variables, which form the CSP, all of which are well defined in the model describing the design-under-verification. Some embodiments of the present invention provide a framework for modeling the places in which the restrictions of the CSP should be loosened in certain scenarios by disabling selected constraints and widening the domains of other properties, while at the same time observing the limitations imposed by the model of the design-under-verification.

One embodiment of the present invention provides a method for functional verification of a design, which is carried out by providing a test template that specifies test parameters directed to a function of the design. The template includes constraints and variables covering a working space within an operational space of the design. The method is further carried out by associating an exemption mode of operation with at least one of the constraints or at least one of the variables, wherein a domain of the variable is modified or the constraint is disabled. As a result, the working space is modified in the exemption mode of operation. The method is further carried out by producing a test case that lies in the operational space of the design by enabling the exemption mode of operation. The test case includes a series of transactions originating from the template, in which the transactions exercise the function of the design. The test case is then submitted for execution by the design.

According to one aspect of the method, the operational space is enlarged in the exemption mode of operation.

According to another aspect of the method, the operational space is reduced in the exemption mode of operation.

A further aspect of the method includes adding a new constraint to the template.

A further aspect of the method includes determining that the test case conforms to a model of the design.

In yet another aspect of the method producing a test case comprises solving a constraint satisfaction problem, wherein in the exemption mode of operation a constraint of the constraint satisfaction problem is modified.

According to still another aspect of the method, in the exemption mode of operation the constraint of the constraint satisfaction problem is relaxed.

According to an additional aspect of the method, in the exemption mode of operation the constraint of the constraint satisfaction problem is restricted.

According to one aspect of the method, the exemption mode of operation is associated with only a portion of the template.

Another aspect of the method includes associating a second exemption mode of operation with at least one of the constraints or one of the variables, wherein the exemption mode of operation and the second exemption mode of operation can be independently enabled and disabled when producing a test case.

One embodiment of the present invention provides a computer software product, including a computer-readable medium in which computer program instructions are stored, which instructions, when read by a computer, cause the computer to perform a method for functional verification of a design, which is carried out by accepting as an input a test template that specifies test parameters directed to a function of the design. The template includes constraints and variables covering a working space within an operational space of the design. The method is further carried out by associating an exemption mode of operation with at least one of the constraints or at least one of the variables, wherein a domain of the variable is modified or the constraint is disabled. As a result, the working space is modified in the exemption mode of operation. The method is further carried out by producing a test case that lies in the operational space of the design by enabling the exemption mode of operation. The test case includes a series of transactions originating from the template, in which the transactions actions exercise the function of the design. The test case is then submitted for execution by the design.

One embodiment of the present invention provides a verification system for functional verification of a design including a processor and a memory accessible by the processor. The processor is operative for functionally verifying the design by performing a method, which is carried out by accepting as an input a test template that specifies test parameters directed to a function of the design. The template includes constraints and variables covering a working space within an operational space of the design. The method is further carried out by associating an exemption mode of operation with at least one of the constraints or at least one of the variables, wherein a domain of the variable is modified or the constraint is disabled. As a result, the working space is modified in the exemption mode of operation. The method is further carried out by producing a test case that lies in the operational space of the design by enabling the exemption mode of operation. The test case includes a series of transactions originating from the template, in which the transactions exercise the function of the design. The test case is then submitted for execution by the design.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

System Overview

Figure 1:
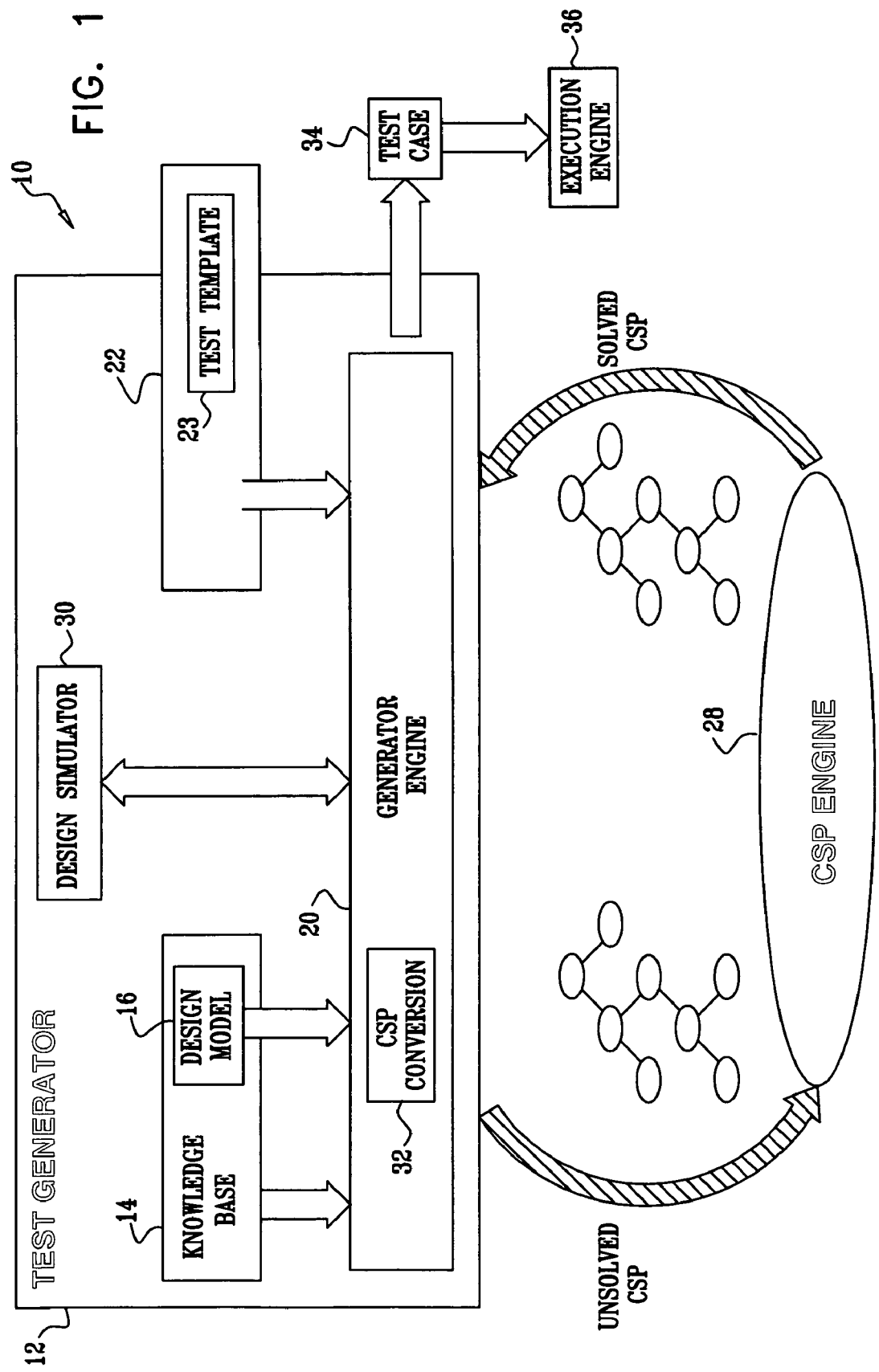
FIG. 1 is a high level block diagram of a design verification system, which is constructed and operative in accordance with a disclosed embodiment of the invention.

Turning now to the drawings, reference is initially made to FIG. 1, which is a high level block diagram of a design verification system 10, which is constructed and operative in accordance with a disclosed embodiment of the invention. The teachings of the present invention are not restricted to systems that are configured like the system 10, but are applicable to many testing systems that have architectures differing from the system 10.

The system 10 is used for verifying an implementation of a design-under-verification. In the present embodiment, the design-under-verification is assumed to be a hardware design, but may alternatively comprise software or combinations of hardware and software elements. The system 10 has several basic interacting components, which enable the creation of tests that have various degrees of randomness. The system 10 is typically realized as a computer that includes a processor and a memory that contains objects corresponding to the functional blocks depicted in FIG. 1. At the heart of the system 10 is a test generator 12. The ability of the test generator 12 to introduce random unspecified values is generally desirable, since design flaws in practice are usually unpredictable.

An abstract knowledge base 14 holds a formal description of the specification of the design-under-verification. This specification may be stored in a database, which may also incorporate testing knowledge of the system design, and may include testing constraints and coverage criteria. The design-under-verification could be any module, e.g., a computer processor, bus-bridge, or DMA controller. The knowledge base 14 includes a general model 16 of a design-under-verification that includes testing knowledge that is helpful in providing test coverage and biasing the generator toward "interesting" cases.

A test generator engine 20 has a user input 22 that comprises at least one test template 23. For example, the template 23 may specify an exercise of the data cache of the processor and result in test cases that are formed by a series of 'store' and 'load' instructions.

The template 23 specifies test parameters that are typically directed to a particular function of the design-under-verification. These parameters are used for the production of many distinct transactions, which are the atomic functional building blocks of the design-under-verification. A simple example is: "Generate 300 to 500 transactions of either a CPU access to memory or an I/O initiated interrupt." A test template directed to this function is submitted to the test generator, whereupon the test generator generates a large number of distinct, well distributed test cases in compliance with the user's specification. Variation among different test cases is achieved through a large number of random decisions made during the generation process.

The template 23 and other information submitted by an operator via the user input 22 serve as one of the inputs for the algorithms used to generate test cases.

In general, a CSP consists of a finite set of variables, a domain for each variable, and a set of constraints. A constraint is a relation defined on some subset of the variables, and denotes valid combinations of their values. A solution to a constraint satisfaction problem is an assignment of a value to each variable from its domain, such that all the constraints are satisfied. Constraint satisfaction problems are discussed in the document *Algorithms for Constraint-Satisfaction Problems: A Survey*, V. Kumar, AI Magazine, 1992, volume 13, number 1, pages 32-44.

In this application, a CSP corresponds to a test case. Indeed, the principles of the invention can be applied to any problem that can be represented as a CSP. Variables represent various attributes of the generated test case, e.g., the address of a processor instruction. Constraints represent required relationships between the attributes, e.g., load instructions can only access addresses that are aligned with a 4-byte boundary. In a CSP-based modeling framework, the CSP defines the set of test cases that can be generated by the test generator engine 20. In the system 10, a single CSP is typically solved multiple times by the CSP engine 28, to produce many distinct solutions. Different solutions for the same CSP are used as different test cases, which together aim to cover a particular functionality or logic in the design-under-verification. The differences between solutions are achieved using randomness as part of the solution process. A common way to specify the template 23 is to reduce the domain of one or more of the variables in the CSP.

The template 23, together with information from knowledge base 14, is often translated into a set of variables and constraints that are solved by the CSP engine 28. As will be appreciated from the detailed discussion below, generation of specific scenarios in a domain that lies beyond the practical domain of the test generator engine 20 is possible by loosening the boundaries of the CSP problem in relevant places. These boundaries are defined by the constraints and the domains of the variables that form the CSP, all of which are well defined in the model 16.

Many generic test generator engines and CSP engines are suitable for the test generator engine 20, suitably modified to permit application of the principles of the invention, which may be accomplished by those skilled in the art. For example, a suitable generator for use as the test generator engine 20 is disclosed in commonly assigned Published U.S. patent application Ser. No. 10/040,940 (Publication No US 2003/0130813 A1), entitled *Adaptive Test Program Generation*, which is herein incorporated by reference. The CSP engine 28 can be the engine that is described in commonly assigned U.K. Application No. 0407260.9, entitled *Accelerated Solution of Constraint Satisfaction Problems by Partitioning of the Variable Space*, which is herein incorporated by reference.

Sometimes, a behavioral simulator or design simulator 30 is included in the system 10. However, the principles of the invention can be applied to test generators that do not employ behavioral simulators.

A test case 34 is executed by an execution engine 36 on an implementation of the design-under-verification. The execution engine 36 can be a simulator of the design-under-verification, or a realization of the design.

The Gap

Figure 2:
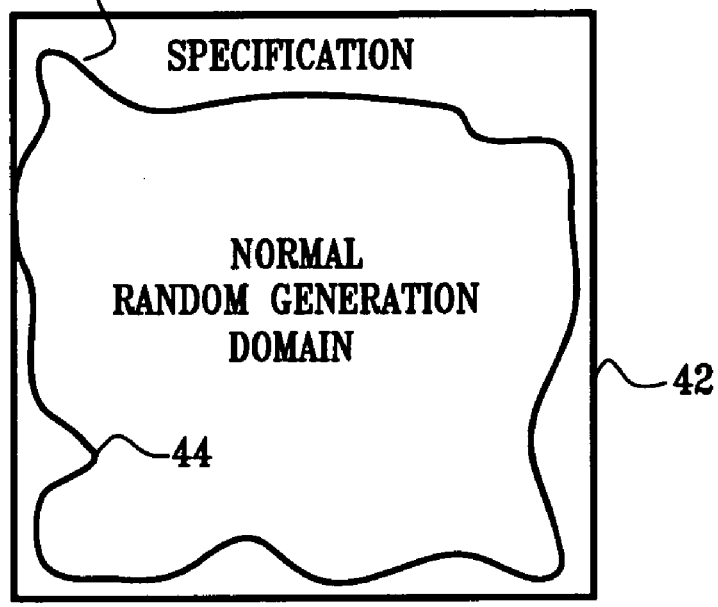
FIG. 2 is a diagram illustrating a gap between the domain of test cases that are legal according to the specification of the design-under-verification, and the actual test cases that are generated by a practical test generator, according to a disclosed embodiment of the invention.

Reference is now made to FIG. 2, which is a diagram illustrating a gap between the domain of test cases that are legal according to the specification of the design-under-verification, and the actual test cases that are generated in a working space by a practical test generator, according to a disclosed embodiment of the invention. The operational space of legal test cases is represented by an area enclosed by a square 42. The working space of the test generator is indicated by a smaller, irregularly outlined closed area 44 located entirely within the square 42. A gap 46 is defined by the area that is outside the area 44 but within the square 42. According to some aspects of the present invention, generation of test cases falling within the gap 46 is facilitated. However, it is important to note that the model 16 (FIG. 1) disallows generation of illegal test cases that would fall in the gap 46 or into a region outside the square 42. In a random generation and simulation environment, the existence of illegal test cases would lead to large numbers of failures, which in turn would result in expensive manual debugging efforts.

In general test cases falling within the gap 46 are difficult or impractical to execute or to verify properly in a simulation. This could be due to considerations of the simulation environment and performance expenses. For example, certain scenarios may require excessive time to generate test cases, or even more importantly, require a great deal of time in an actual simulation. Furthermore, modeling the area at the boundary of the square 42 (the boundary between legal and illegal test cases) can require a significant amount of time and effort. Another difficulty is presented by the inability of checking mechanisms in simulation and execution environments to handle some kinds of test cases. Conventionally, it was preferable to simply restrict the model so as to avoid the boundary. Unfortunately, this leads to the exclusion of many interesting scenarios.

The following are examples of specific scenarios that lie in the gap 46 and need to be checked as part of a verification plan:

EXAMPLE 1

Assume that the specification of the design-under-verification defines a transaction, in which a list of blocks is being copied from one memory (or memory location) to another. In many cases, running a test that examines this functionality on a hardware simulator might require a significant amount of time and resources, especially when the list has a large number of elements. Therefore, it was previously considered reasonable to limit the list size when generating test cases, and to verify the functionality of large numbers of elements only in only few test cases that would not be randomly generated as part of the regular verification environment.

EXAMPLE 2

Error conditions that the design-under-verification needs to handle often lie in the gap 46, since it is difficult to test the reaction to such errors in a random simulation environment. For instance, assume a processor has alignment requirements that need to be observed when executing read or write operations. According to the processor's specification, violation of these requirements results in an error. Normally, one would avoid generating tests that trigger such an error, since it is likely that the checking environment would fail if such an error were to occur. Nevertheless, verifying that the alignment error is indeed appropriately triggered is an important task. Here, exceptionally, the test generator is allowed to generate illegal scenarios in order to test the error-handling capabilities of the design-under-verification.

Possible approaches for checking specific scenarios that lie in the gap 46 include the following:

(1) One could manually write test cases (directed tests), or manually change a randomly generated test, so that it includes the required scenario. Such a solution is expensive in terms of writing the test and maintenance, and lacks coverage, since the modified test would not generally include many other scenarios that might be relevant for verification.

(2) Ad hoc changes to the model of the design-under-verification could be introduced whenever it is desired to generate a specific scenario. This approach is expensive in terms of maintenance, and would likely fail to cover other related scenarios.

Exemption Modes

The invention provides a framework for modeling the places in which the boundaries of a CSP should be loosened in certain scenarios by disabling selected constraints and widening domains of certain properties, while at the same time observing the limitations imposed by the model of the design-under-verification.

This framework is provided through the concept of exemption modes. Each exemption mode represents a family of scenarios that lie in the gap 46 (FIG. 2). As described above, such scenarios would normally be avoided by a test generator. By default, all exemption modes are disabled, meaning they have no effect on the solution of the CSP, and thus on the test case that will be generated. However, if such a mode is enabled in a test template, then the constraints and variables on which the particular mode was modeled are affected. As a consequence, the CSP engine 28 (FIG. 1) may arrive at a solution that lies in the gap 46.

Enabling an exemption mode in a test template is facilitated by a simple user interface, and may be allowed in conjunction with other exemption modes. Exemption modes may be restricted to certain portions of a test, as shown in Listing 1.

| Listing 1 |
|---|
| generate 30 transactions of type A |
| generate 50 transactions of type B |
| turn on exemption mode X |
| generate 40 transactions of type A |
| turn on exemption mode Y |
| generate 50 transactions of either type B or type C |
| turn off exemption mode Y |
| turn off exemption mode X. |

Figure 3:
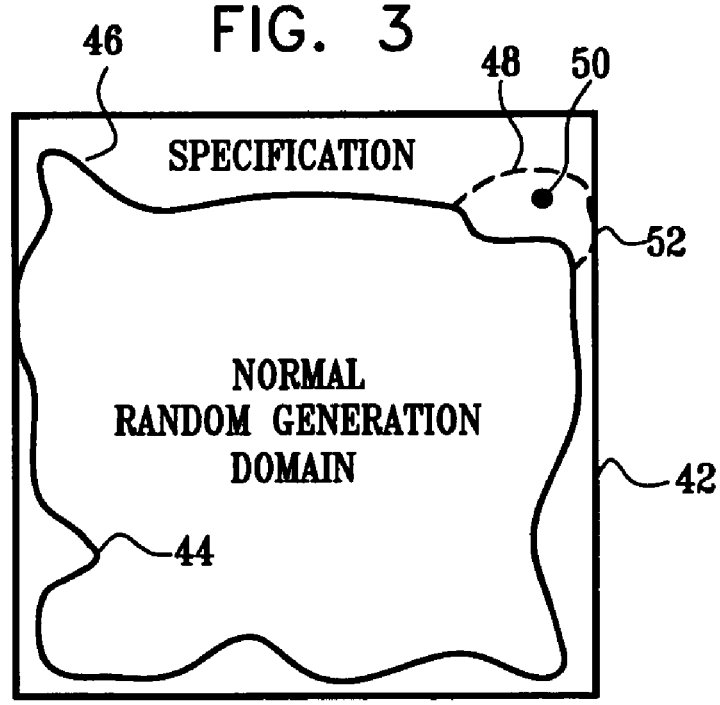
FIG. 3 is a diagram illustrating a scenario that is found in a gap between the domain of valid test cases that are legal according to the specification of a design-under-verification, and the domain of test cases that are generated by a test generator, according to a disclosed embodiment of the invention.

Reference is now made to FIG. 3, which is a diagram illustrating a scenario that is found in a gap between the operational space of test cases that are legal according to the specification of the design-under-verification, and the working space of test cases that are generated by a practical test generator, according to a disclosed embodiment of the invention. FIG. 3 is similar to FIG. 2. However, a portion of the boundary of the area 44 has been expanded to encroach on the gap 46, as indicated by a broken line 48. Using relaxed constraints and loosened variables domains that allow the test generator to produce scenarios falling within the expansion of the area 44, a scenario 50 has been defined, which lies inside the line 48 and within the original borders of the gap 46. While the line 48 touches the boundary of the square 42 at a point 52, it should be noted that the line 48 does not extend beyond the boundary of the square 42. This indicates that the scenario 50 is not illegal per se. Nevertheless, attention should be directed to the scenario 50 to verify that it complies with the model of the design-under-verification.

Modeling Exemption Modes

The modeler of a design-under-verification may define a set of exemption modes. Each exemption mode is intended to target a family of scenarios that lie in the gap 46 (FIG. 2). In the absence of exemption modes, generation of such a family is avoided by a test generator for the reasons given above.

An exemption may be attached to constraints and variables. Several exemptions may be attached to the same constraint or variable, and can be independently enabled and disabled. When an exemption is in force, an exemption mode of operation is said to be enabled.

If attached to a variable, and when enabled, the exemption mode specifies a revised domain of the variable. This domain is usually a superset of the variable's usual domain, since exemption modes are generally intended to loosen CSP constraints. If attached to a constraint, the constraint is disabled when the exemption mode is activated (enabled). It will be recalled that by default, all exemption modes are disabled.

Enabling an Exemption Mode

An exemption mode is enabled in a test template. Several exemption modes may be enabled together. It is also possible to enable or disable exemption modes in a portion of the sections of the test template. Consider the example shown in Listing 2. In this example, there are two exemption modes that are enabled in section__1. These exemption modes apply to all elements in the section. However, transaction__1__2 disables exemption_mode__2, leaving only exemption_mode__1 enabled. Section__1__1 disables exemption_mode__1, leaving only exemption_mode__2 enabled. In section__2, there are no enabled exemption modes. As noted above, exemption modes are disabled by default, unless explicitly enabled.

```
                          Listing 2 start_template
     section_1: (enable exemption_mode_1, enable
   exemption_mode_2)
         transaction_1_1
         transaction_1_2 (disable exemption_mode_2)
         section_1_1 (disable exemption_mode_1)
     section_2
         transaction_2_1
     end_template
```

When enabled, an exemption mode may lead to a solution of a CSP, in which a variable has a value that is outside its original legal domain. This is done by disabling the constraints to which the variable was attached. Accordingly, the disabled constraints are ignored by the CSP engine 28 (FIG. 1). In addition, the domain of the variable can be widened, according to the model of the design-under-verification.

Sometimes, when boundaries of the model are loosened, illegal test cases can be generated. Therefore, the responsibility for producing a legal test is partially delegated to the test template writer, who needs to prepare the template in a manner that will lead to the desired results, as shown in FIG. 3.

Referring again to Example 1, verifying that the design-under-verification works well when copying a large number of blocks from one memory to another is possible through modeling the size of the list to be always small, e.g., maximum size 20 elements, while defining a special exemption mode that allows generation of a test with a large number of elements. Thus, only tests with small lists are generated and simulated in a normal mode of operation. The functionality of the design-under-verification involving lists having a large number of elements would be checked only in a few cases, in which the special exemption mode is enabled.

Referring again to Example 2, verifying that an alignment error is appropriately triggered in different situations may be accomplished using an exemption mode. Such an exemption mode would be attached to the constraint, which enforces the alignment rules on the processor. When enabled, it would cause this constraint to be ignored. The test generator would then be free to generate test cases that fail to comply with the alignment requirements of the design-under-verification.

Figure 4:
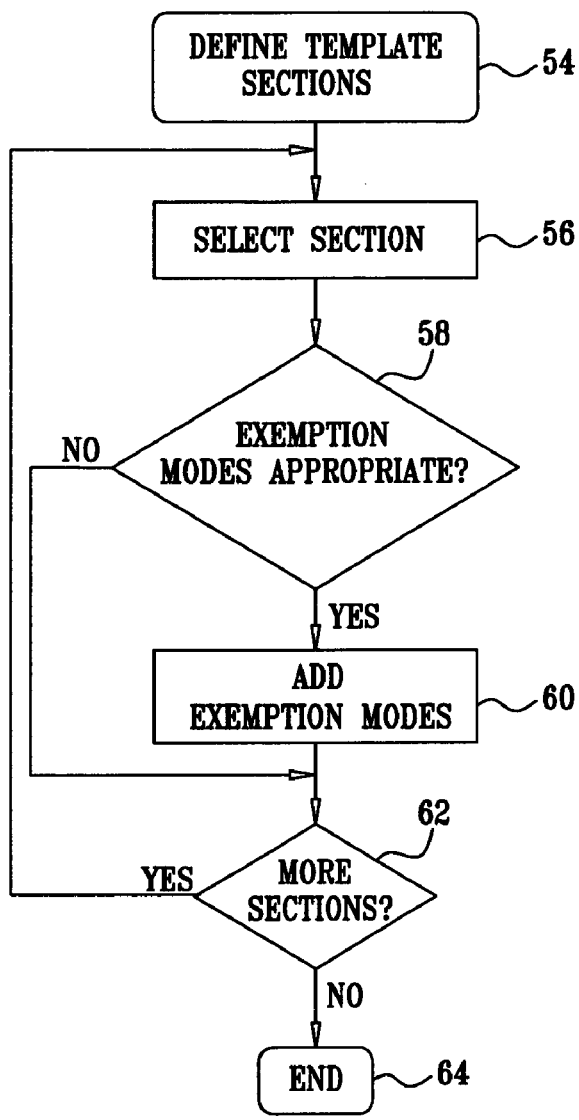
FIG. 4 is a flow chart illustrating a method of associating exemption modes with a test template in accordance with a disclosed embodiment of the invention.

Reference is now made to FIG. 4, which is a flow chart illustrating a method of associating exemption modes with a test template in accordance with a disclosed embodiment of the invention. At initial step 54 a test template is selected and divided into sections that are associated with variables and constraints, and in general represent a conceptual family of scenarios that may be of interest in the evaluation of a design-under-verification.

Next, at step 56 one of the sections of the template is selected.

Control now proceeds to decision step 58, where it is determined if the currently selected section is appropriate for association with an exemption mode that can be enabled during test case generation. This decision is normally made by engineers who are familiar with the design-under-verification. If the determination at decision step 58 is affirmative, then control proceeds to step 60. One or more exemption modes for the current section are added to the template. Control passes to decision step 62.

If the determination at decision step 58 is negative, then control proceeds directly to decision step 62.

At decision step 62 it is determined if more sections of the template remain to be evaluated. If the determination at decision step 62 is affirmative, then control returns to step 56.

If the determination at decision step 62 is negative, then control proceeds to final step 64. The modified template is now available for use in test case generation. The procedure terminates.

The advantages of using exemption modes are clear, especially in comparison to the other solutions detailed above:

(1) It is easy to model the exact places where the boundaries of the area 44 (FIG. 2) may be expanded to include at least a portion of the original gap 46. The resulting model contains all the possible boundary expansions, which simplifies maintenance. Moreover, should changes in the specification of the design-under-verification occur that might affect boundary expansions, revision of the boundary expansions in the model is relatively easy to accomplish.

(2) Generating a scenario by enabling an exemption mode, provides a simple way to create test templates that explore that scenario.

(3) Ultimately, all the above mentioned considerations lead to improved verification of the design-under-verification, since the cost of creating test cases, which explore scenarios lying in the gap 46 (FIG. 2) is much easier than the other above-noted approaches. Using the inventive technique, the coverage of the resulting test cases is improved significantly.

Alternative Embodiment

As described above, modifications to variables and constraints in a test template are generally intended to relax the limitations that govern a test generator so as to produce scenarios that fall in the gap 46 (FIG. 2). However, in some applications, it may be desirable to further limit the test generator. For example, when a flaw was exposed, but not yet fixed, in the design-under-verification. In this case, it is desirable to avoid generation of tests that would expose the same design flaw time after time again. To further improve the efficiency of a verification plan, one can create an exemption mode of operation by revising the domain of variables, or by creating new constraints so as to reduce the area 44. In either case, the constraints of the CSP solved by the CSP engine 28 (FIG. 1) are further restricted.

Figure 5:
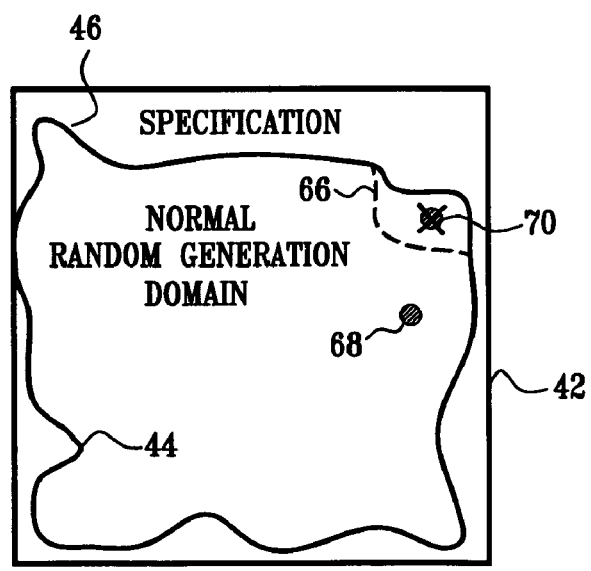
FIG. 5 is a diagram illustrating reduction of an operative domain of a test generator for a design-under-verification, according to a disclosed embodiment of the invention.

Reference is now made to FIG. 5, which is a diagram similar to FIG. 3, illustrating reduction of a working space of a test generator for a design-under-verification, according to a disclosed embodiment of the invention. It is assumed that a special exemption mode has been associated with a test template as described above. However, revision of the domain main of a variable or creation of a new constraint has reduced the area 44. The new boundary of the area 44 is shown by a broken line 66. A scenario 68 may be generated whether or not the special exemption mode is in effect. However, a scenario 70, which could have been generated if the special exemption mode were disabled, would no longer be generated when the special exemption mode is enabled.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. A method for functional verification of a design having an operational space, the method comprising the steps of:

providing a test template that specifies test parameters directed to a function of said design, said template comprising constraints and variables covering a working space within said operational space;

associating an exemption mode of operation with at least one of said constraints or at least one of said variables, wherein a domain of said at least one of said variables is modified or said at least one of said constraints is disabled in said exemption mode of operation;

producing a test case that lies in said operational space of said design by enabling said exemption mode of operation, said test case comprising a series of transactions originating from said template, wherein said transactions exercise said function of said design, wherein said working space is modified in said exemption mode of operation; and submitting said test case for execution by said design, wherein said exemption mode of operation is associated with only a portion of said template.

2. The method according to claim 1, further comprising the step of associating a second exemption mode of operation with at least one of said constraints or one of said variables, wherein said exemption mode of operation and said second exemption mode of operation can be independently enabled and disabled when performing said step of producing a test case.

* * * * *